United States Patent [19]
Dickerson

[11] Patent Number: 5,355,533
[45] Date of Patent: Oct. 11, 1994

[54] METHOD AND CIRCUIT FOR RADIO FREQUENCY SIGNAL DETECTION AND INTERFERENCE SUPPRESSION

[75] Inventor: Roger W. Dickerson, Montgomery, Ohio

[73] Assignee: Xetron Corporation, Cincinnati, Ohio

[21] Appl. No.: 806,060

[22] Filed: Dec. 11, 1991

[51] Int. Cl.$^5$ .................. H04B 1/12; H04B 1/26; H03B 19/10
[52] U.S. Cl. .................. 455/306; 455/307; 455/318; 307/529; 328/167; 333/17.1; 333/168
[58] Field of Search .............. 455/295, 296, 303, 304, 455/305, 306, 307, 308, 318; 307/520, 521, 529; 328/162, 163, 165, 167; 333/17.1, 174, 117, 167, 168

[56] References Cited

U.S. PATENT DOCUMENTS

| | | | |
|---|---|---|---|
| 3,287,645 | 11/1966 | Baghdady | 455/296 |
| 3,307,408 | 3/1967 | Thomas et al. | 328/167 |
| 3,493,876 | 2/1970 | Zimmerman | 328/167 |
| 3,522,457 | 8/1970 | Perra | 307/521 |
| 3,911,366 | 10/1975 | Baghdady | 455/303 |
| 3,987,396 | 10/1976 | Kreger | 455/19 |
| 4,051,438 | 9/1977 | Pickett et al. | 455/105 |
| 4,087,750 | 5/1978 | Allen et al. | 455/296 |
| 4,088,955 | 5/1978 | Baghdady | 455/303 |
| 4,283,693 | 8/1981 | Saenz | 333/174 |
| 4,328,591 | 5/1982 | Baghdady | 455/303 |
| 4,513,249 | 4/1985 | Baghdady | 328/167 |
| 4,920,348 | 4/1990 | Baghdady | 455/283 |
| 4,998,289 | 3/1991 | Rabe et al. | 455/296 |
| 5,203,030 | 4/1993 | Kawasaki | 455/304 |

FOREIGN PATENT DOCUMENTS 9015486 12/1990 PCT Int'l Appl. .......... 455/295

*Primary Examiner*—Edward F. Urban
*Assistant Examiner*—Mark D. Wisler

[57] ABSTRACT

This invention provides a method and circuit for separating a signal of interest from a composite signal including a signal of interest and an angle modulated interfering signal, in which an in-phase component of a reference signal representative of a composite signal is mixed with the composite signal to produce a first compound signal, selected components from the first compound signal are removed to produce a first filtered signal, and the in-phase component of the reference signal is mixed with the first filtered signal to produce a second compound signal. Similarly, a quadrature component of the reference signal is mixed with the composite signal to produce a third compound signal, selected components from the third compound signal are removed to produce a second filtered signal, and the quadrature component of the reference signal is mixed with the second filtered signal to produce a fourth compound signal. The second and fourth compound signal are combined to produce an output signal in which the spectral power density of the signal of interest is greater than the spectral power density of the interfering signal. In an alternative embodiment, the reference signal may be derived from either a the first or third compound signal or both. The reference signal may alternatively be representative of the interfering signal.

32 Claims, 8 Drawing Sheets

METHOD AND CIRCUIT FOR RADIO FREQUENCY SIGNAL DETECTION AND INTERFERENCE SUPPRESSION

BACKGROUND OF THE INVENTION

This invention relates to methods and circuits for separating a radio frequency signal of interest from a co-channel interfering signal, and to receivers which employ such methods and circuits.

In the reception of radio frequency signals, a situation is frequently encountered in which a weak signal of interest (SOI) is subject to interference by a strong interfering signal having a frequency band which encompasses that of the SOI. The interfering signal may be, for example, a jamming signal or a commercial radio or television signal. One type of signal of interest is a digital subcarrier that broadcasts digital audio beneath a commercial radio broadcast. The separation of the SOI from the undesired interfering signal under these conditions is not achievable with standard linear or frequency selective filter networks.

Various techniques such as phase and amplitude cancellation systems and steerable null antenna systems have been used to attempt to separate a signal of interest from an interfering signal. Such systems require multiple antenna apertures, accurate phase and gain matching, and/or geographic separation of the signal of interest source and the interfering signal source.

Certain conditions may provide a sample of the undesired interfering signal which can be algebraically subtracted from the combined signal to expose the desired signal of interest. This is feasible only if three conditions are met. First, the sample of undesired interfering signal must be corrected for amplitude, phase and group delay. Second, the sample must have a noise floor equal to less than the desired signal of interest. Finally, the sample must have a make-up, in amplitude or phase, different from that of the combined signal in order to avoid cancelling the signal of interest. Where a sample of undesired interfering signal of sufficient quality is unavailable, this technique cannot be used.

The present invention seeks to provide a method and circuit for detecting a radio frequency signal of interest in the presence of an interfering radio frequency signal, without requiring multiple antenna apertures, and/or geographic separation of the signal of interest source and the interfering signal source.

SUMMARY OF THE INVENTION

Circuits for separating a signal of interest from a composite signal including a signal of interest and an angle modulated interfering signal, include a first mixer for mixing an in phase component of a reference signal representative of the composite signal with the composite signal to produce a first compound signal, a first filter circuit for removing selected components from the first compound signal to produce a first filtered signal, and a second mixer for mixing the in-phase component of the reference signal with the first filtered signal to produce a second compound signal. A third mixer mixes a quadrature component of the reference signal with the composite signal to produce a third compound signal. A second filter circuit removes selected components from the third compound signal to produce a second filtered signal, and a fourth mixer mixes the quadrature component of the reference signal with the second filtered signal to produce a fourth compound signal. The second and fourth compound signals are combined to produce an output signal in which the spectral power density of the signal of interest is greater than the spectral power density of the interfering signal. The reference signal may alternatively be derived from the first compound signal, the third compound signal, or a combination of the first and third compound signals. In alternative embodiments, the first and third compound signals may be combined into a single signal which is filtered by a single filter, or only one of the first and third compound signals may be selected for filtering and subsequent processing. For applications where a clean sample of the interfering signal is available, the reference signal is representative of the interfering signal.

The invention also encompasses the signal detection method performed by the above apparatus in which an in phase component of a reference signal representative of a composite signal is mixed with the composite signal to produce a first compound signal, selected components from the first compound signal are removed to produce a first filtered signal, and the in-phase component of the reference signal is mixed with the first filtered signal to produce a second compound signal. Similarly, a quadrature component of the reference signal is mixed with the composite signal to produce a third compound signal, selected components from the third compound signal are removed to produce a second filtered signal, and the quadrature component of the reference signal is mixed with the second filtered signal to produce a fourth compound signal. The second and fourth compound signals are combined to produce an output signal in which the spectral power density of the signal of interest is greater than the spectral power density of the interfering signal. Here again, the reference signal may alternatively be derived from the first compound signal, the third compound signal, or a combination of the first and third compound signals. In alternative embodiments, the first and third compound signals may be combined into a single signal which is filtered by a single filter, or only one of the first and third compound signals may be selected for filtering and subsequent processing. In another alternative embodiment, the reference signal is representative of the interfering signal.

BRIEF DESCRIPTION OF THE DRAWINGS

The invention will become more readily apparent to those skilled in the art through the following description of the preferred embodiments thereof, as illustrated in the drawings, wherein.

DESCRIPTION OF THE PREFERRED EMBODIMENTS

Circuits constructed in accordance with this invention provide either cooperative or non-cooperative suppression of high-level interference signals to enhance the detection of a co-channel low-level signal of interest (SOI). In this context, cooperative suppression refers to suppression of an interfering signal in which a sample of the interfering signal is available, and non-cooperative suppression refers to suppression of an interfering signal which does not require a reference sample of the interfering signal. The invention operates on an interference corrupted signal to produce an enhanced version of the desired SOI. Circuits constructed in accordance with this invention can be readily retrofitted within the intermediate frequency (IF) stage of existing receiver systems.

Figure 1:
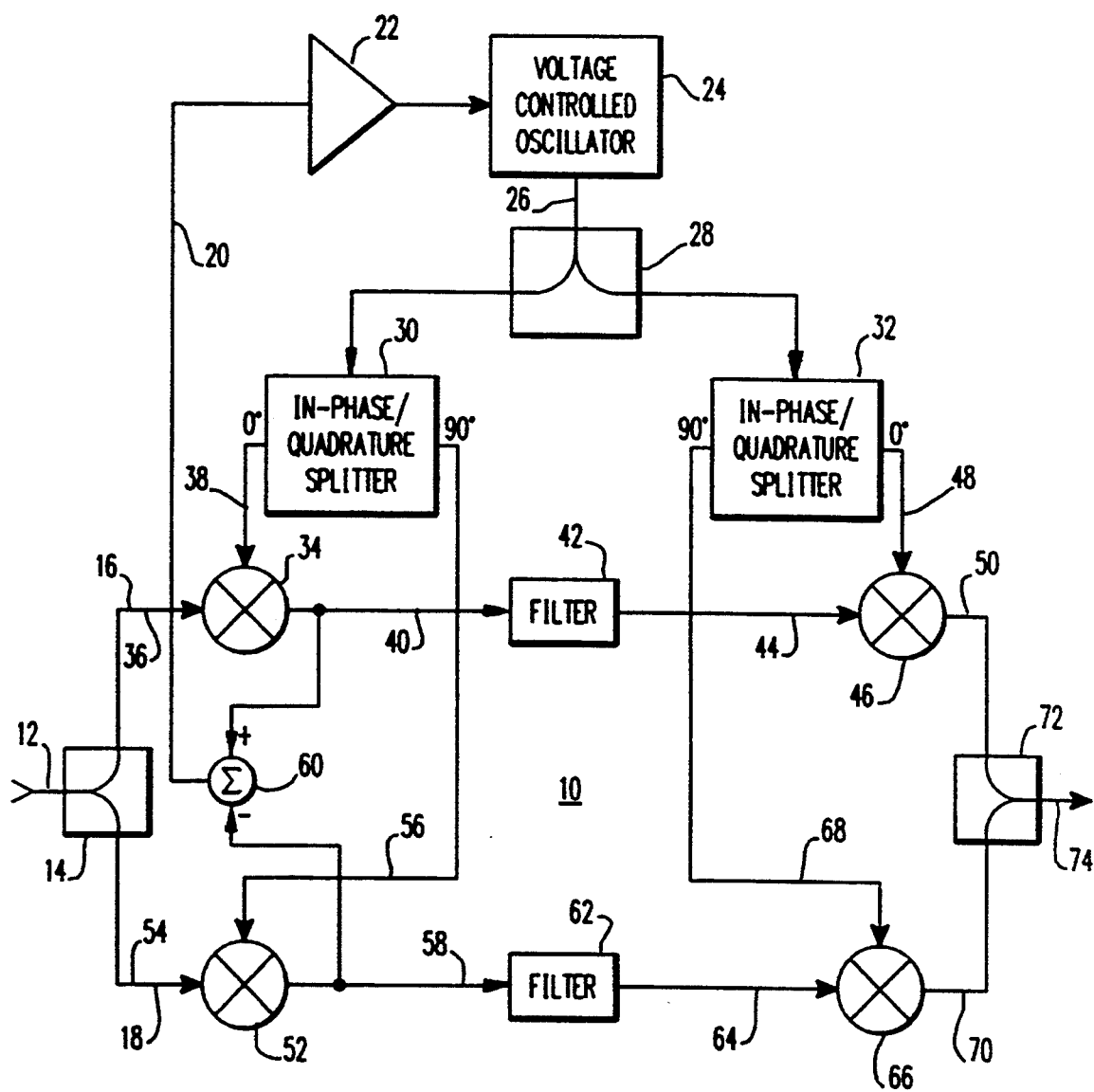
FIG. 1 is a block diagram of an interference suppression circuit constructed in accordance with a first embodiment of this invention.

Referring to the drawings, FIG. 1 is a block diagram of an interference suppression circuit 10 constructed in accordance with a first embodiment of this invention. This circuit is used for non-cooperative suppression, i.e., where a sample of the interfering signal is unavailable. A composite signal, including both an angle modulated interfering signal (I) and a signal of interest (SOI) is supplied to the interference suppression circuit 10 by way of input line 12. A signal splitter 14 splits the composite signal and delivers it to a first channel 16 and a second channel 18. An error signal on line 20 is amplified by amplifier 22 and used by a voltage controlled oscillator 24 to produce a reference signal on line 26. The reference signal on line 26 is split by a splitter 28 and sent to first and second in-phase/quadrature splitters 30 and 32, respectively. The in-phase/quadrature splitters produce a first output which is the in phase component of the reference signal (0 degrees) and a second output which is the quadrature component of the reference signal (90 degrees). A first mixer 34 mixes the composite signal on line 36 with the in-phase component of the reference signal on line 38 to produce a first compound signal on line 40. A filter 42 removes selected components of the first compound signal to produce a first filtered signal on line 44. A second mixer 46 mixes the first filtered signal on line 44 with an in-phase component of the reference signal on line 48 to produce a second compound signal on line 50.

A third mixer 52 mixes the composite signal on line 54 with a quadrature component of the reference signal on line 56 to produce a third compound signal on line 58. The error signal on line 20 is the difference in voltage between the first and third compound signals as produced at the output of summation point 60. A second filter 62, which is matched to filter 42, removes selected components of the third compound signal and produces a second filtered signal on line 64. A fourth mixer 66 mixes the second filtered signal on line 64 with a quadrature component of the reference signal on line 68 to produce a fourth compound signal on line 70. The second and fourth compound signals are combined by combiner 72 to produce an output signal on line 74. The spectral power density of the signal of interest in the output signal is greater than the spectral power density of the interfering signal in the output signal. Therefore the signal of interest in the output signal can be easily captured by well known signal capture circuits.

Although the error signal in FIG. 1 is shown to be derived from the difference between the first and third compound signals, it should be understood that the error signal may alternatively be derived from the summation of the signals on lines 40 and 58 with any polarity and weighting. Alternatively, the error signal may be derived from either the first or third compound signal.

The gain and frequency response of the error amplifier 22 controls the depth and bandwidth of the interference suppression. If the bandwidth of the SOI is much less than the bandwidth of the interfering signal, then maximum gain is desirable. Cancellation will be limited by the open loop gain at the highest frequency which modulates the interfering signal with significant deviation. The two signals 40 and 58 carry essentially the same information for frequencies at which the loop gain is large. In the case of maximum gain the signals 40 and 58 may be added, filtered and equalized as one signal with no degradation in the quality of the output signal. The combined signal would then drive signals 44 and 64 simultaneously.

Figure 2:
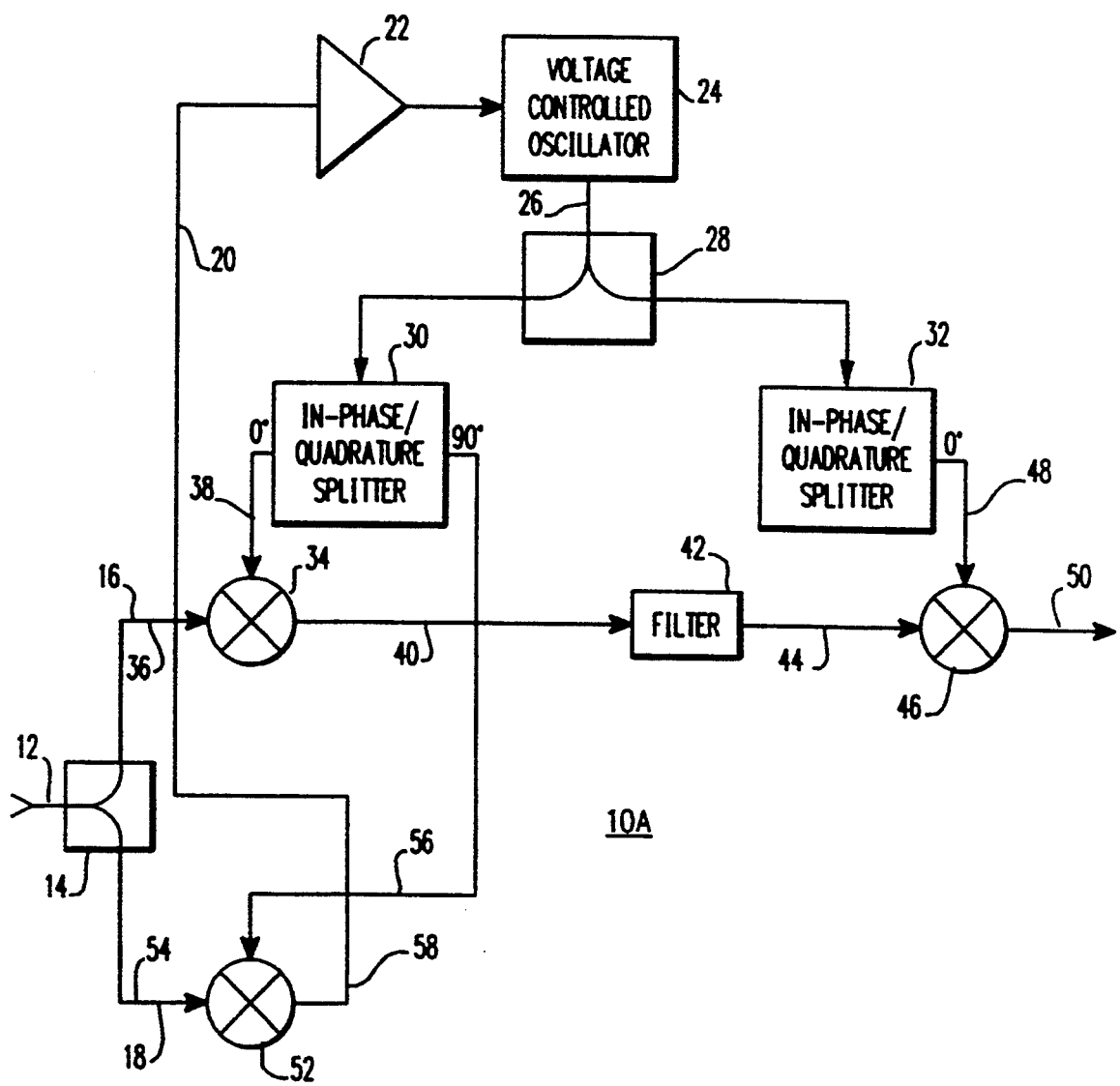
FIG. 2 is a block diagram of an alternative embodiment of an interference suppression circuit constructed in accordance with this invention.
Figure 14:
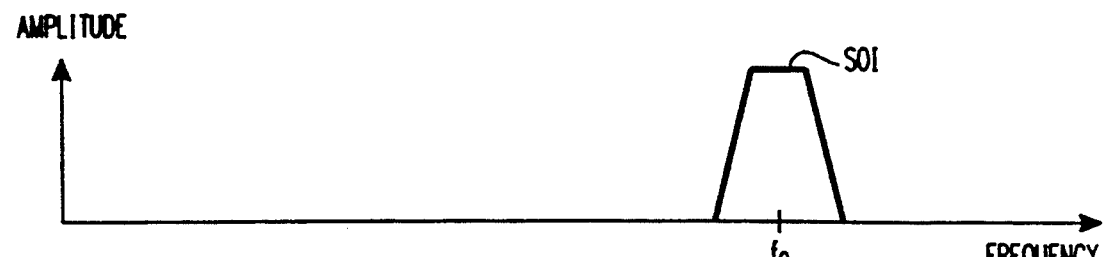

FIG. 2 is a single channel version 10A of the present invention. In FIG. 2, only channel 16 is used. The signal on line 50 serves as the output and the error signal is derived from line 58. A similar embodiment can be constructed using only channel 18 of FIG. 1. In that case, the signal on line 70 serves as the output and the error signal is derived from line 40. If the bandwidth of the SOI is greater than the bandwidth of the interfering signal, then only enough gain should be used to track the modulation of the interfering signal. Additional gain serves only to increase the magnitude of the I×I×SOI term in the output. If the SOI bandwidth is sufficiently large relative to the bandwidth of the interfering signal, then performance such as shown in FIG. 14 is possible even with a non-cooperative embodiment.

Figure 3:
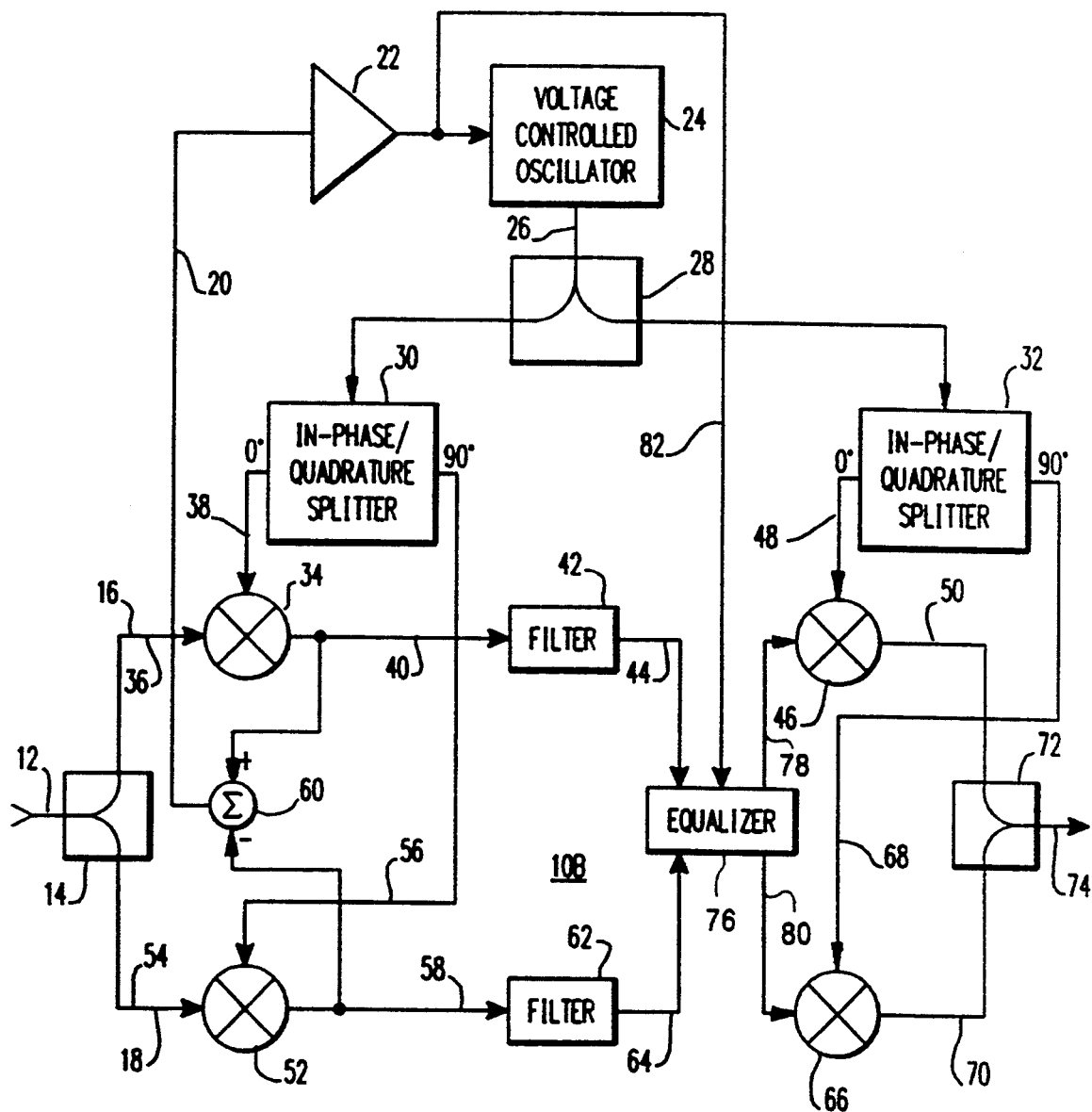
FIG. 3 is a block diagram of an interference suppression circuit constructed in accordance with a third embodiment of this invention.

FIG. 3 is a block diagram of a circuit 10B constructed in accordance with an alternative embodiment of the invention. This embodiment includes all of the components previously described with respect to FIG. 1, and further includes a equalizer 76 which receives the first and second filtered signals on lines 44 and 64 and produces modified first and second filtered signals on lines 78 and 80 respectively. This is accomplished by reducing the amplitude modulation in the portion of the first and second filtered signals which corresponds to the interfering signal.

Figure 4:
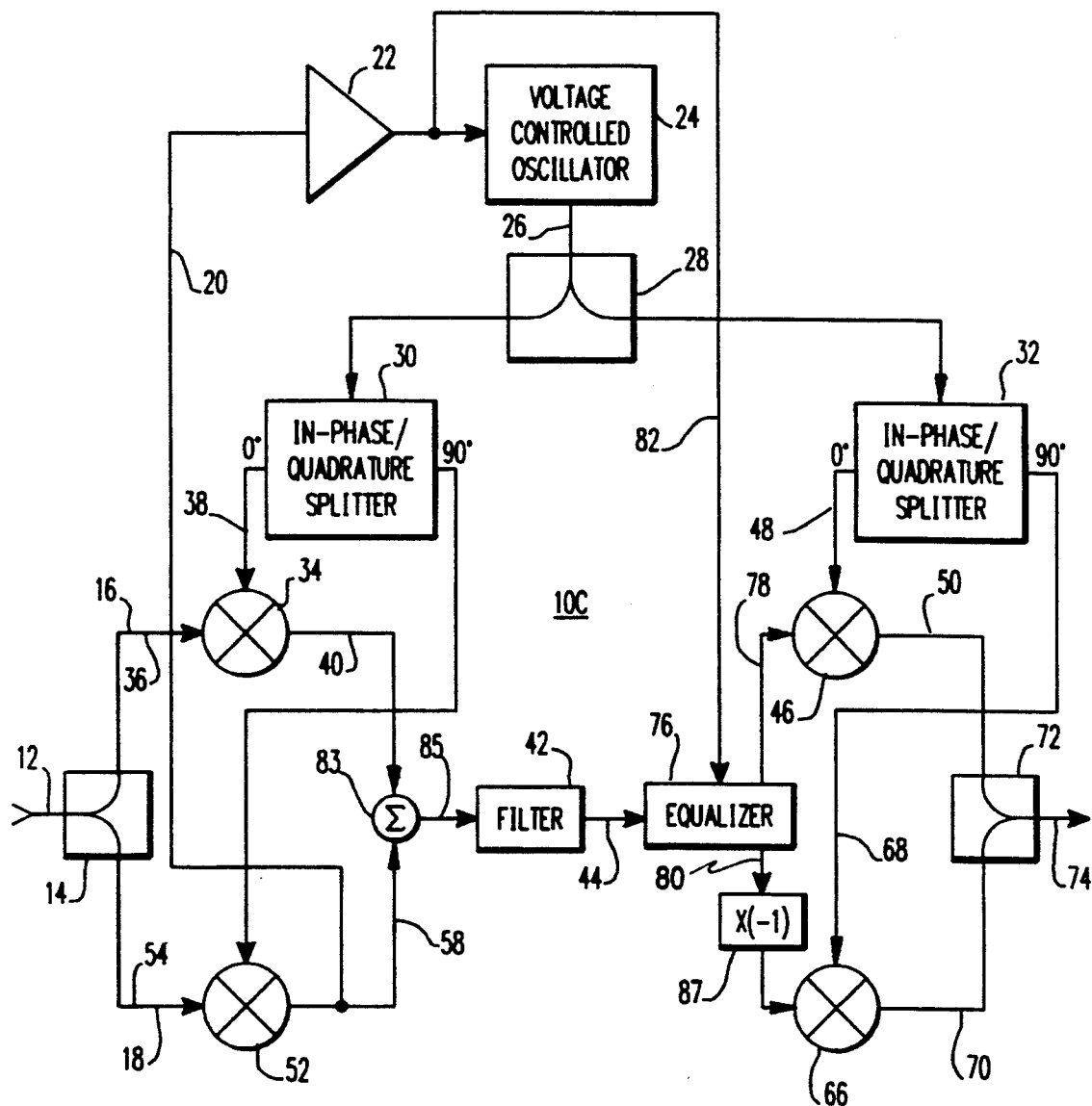
FIG. 4 is a block diagram of an interference suppression circuit constructed in accordance with a fourth embodiment of this invention.

FIG. 4 is another alternative version 10C of the present invention. In FIG. 4, the output of mixer 52 serves as the error signal. The signals on lines 40 and 58 are combined in summer 83 to produce a combined signal on line 85 which is filtered by filter 42. An inverter 87 is used, if needed, to ensure that the polarity of the signal going into mixer 66 is opposite to the polarity of the signal on line 58. The in-phase and quadrature outputs of splitters 30 and 32 may be reversed to construct yet another embodiment of the invention.

The outputs of the mixers in the circuits of FIGS. 1, 2, 3 and 4 are linear representations of the mixer input signals, and include signal components which are centered about the sum and difference of the frequencies of the mixer input signals. As a result of the homodyne architecture of the circuits, in which the composite signal is mixed (multiplied) with a signal representative of itself, the outputs of mixers 34 and 52 are compound signals which include components corresponding to the cross-products of: the interfering signal with itself (I×I) centered at both zero frequency and at twice the carrier frequency of the interfering signal; the signal of interest with itself (SOI×SOI) centered at both zero frequency and twice the carrier frequency of the signal of interest; and the interfering signal with the signal of interest (I×SOI) centered at both zero frequency and the sum of the carrier frequencies of the interfering signal and the signal of interest.

The first and third compound signals are filtered to remove the components of the composite signal which correspond to the cross-products of: the interfering signal with itself (I×I) centered at both zero frequency and at twice the carrier frequency of the interfering signal; and the interfering signal with the signal of interest (I×SOI) centered at the sum of the carrier frequencies of the interfering signal and the signal of interest. Since the signal of interest is assumed to have an amplitude which is smaller than the interfering signal, the component of the composite signal which corresponds to the cross product of the signal of interest with itself (SOI×SOI) is considered to be insignificant. The filtered signals are then supplied to second and fourth mixers which mix the filtered signals with in phase and quadrature components of the reference signal, respectively. The outputs of the second and fourth mixers then include components representative of the cross-products of: the signal of interest itself; and twice the interfering signal with the signal of interest (I×I×SOI). At this point, the amplitude of the output signal component representative of the signal of interest has a greater spectral power density than that of the output signal component representative of twice the cross product of the interfering signal with the signal of interest. Therefore, the signal of interest can be injected into the intermediate stage of an associated receiver and easily detected by known receiver circuits.

Figure 5:
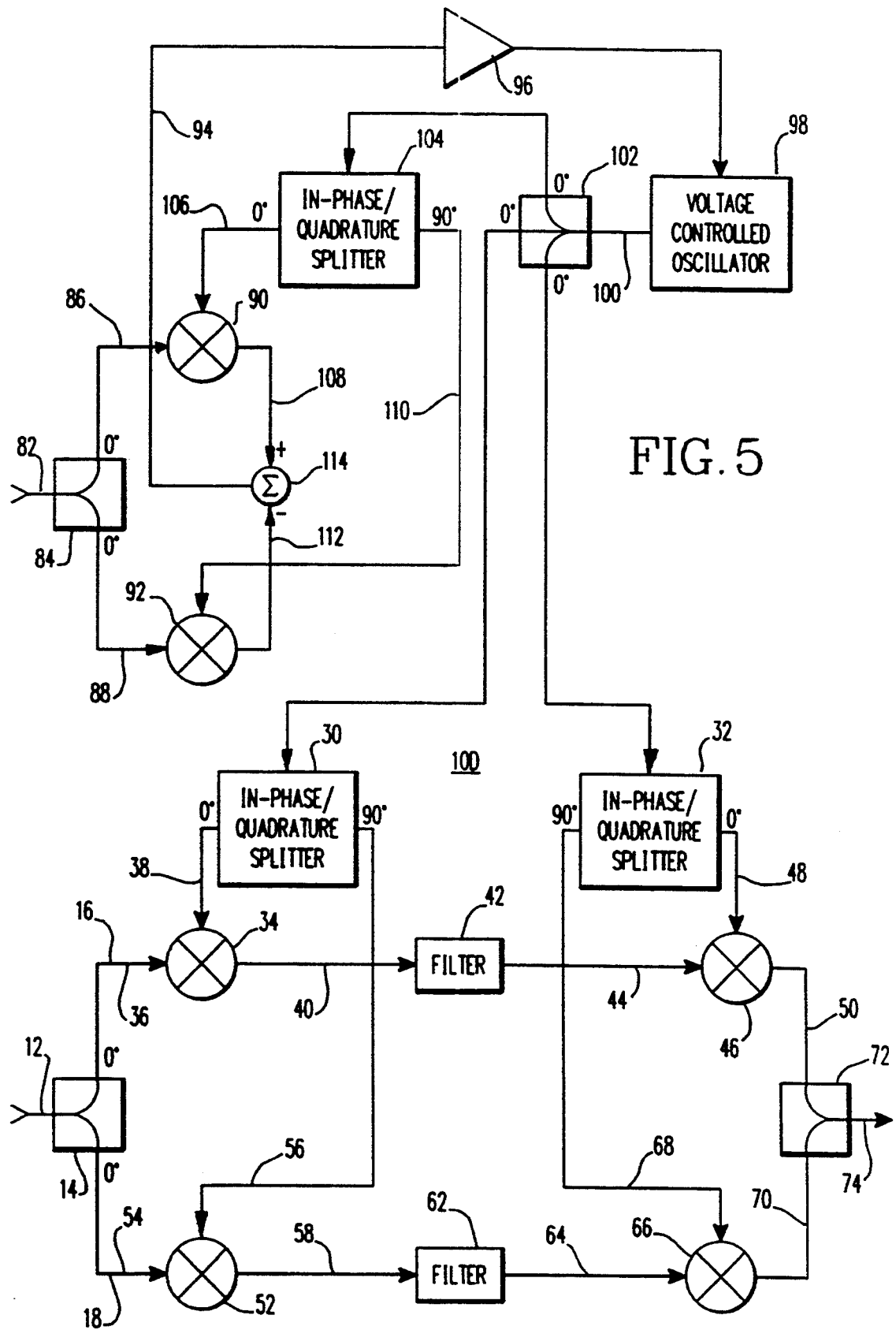
FIG. 5 is a block diagram of an interference suppression circuit constructed in accordance with a fifth embodiment of this invention.

FIG. 5 is a block diagram of an interference suppression circuit 10D constructed in accordance with another embodiment of this invention. This embodiment is used to provide cooperative suppression. That is, it is useful where a clean sample of the interfering signal is available. FIG. 5 includes many of the elements of the circuit of FIG. 1. A composite signal, including both an angle modulated interfering signal (I) and a signal of interest (SOI) is supplied to the interference suppression circuit 10D by way of input line 12. However, unlike the circuits of FIGS. 1, 2, 3 and 4, the reference signal in FIG. 5 is not derived from the first and second compound signals, but rather is derived from a sample of the interfering signal applied to input line 82. Splitter 84 delivers the interfering signal via lines 86 and 88 to fifth and sixth mixers 90 and 92, respectively. An error signal on line 94 is amplified by amplifier 96 and used by voltage controlled oscillator 98 to produce a reference signal on line 100. Splitter 102 sends the reference signal to in-phase/quadrature splitters 30, 32 and 104. Splitter 104 delivers an in phase component of the reference signal to the fifth mixer 90 via line 106. The fifth mixer mixes the in phase component of the reference signal with the interfering signal to produce a fifth compound signal on line 108. A quadrature component of the reference signal on line 110 is mixed with the interfering signal by the sixth mixer 92 to produce a sixth compound signal on line 112. Summation point 114 receives the fifth and sixth compound signals and produces the error signal on line 94. The error signal is then the difference between the voltages of the fifth and sixth compound signals.

In the circuits of FIG. 1, 2, 3, 4 and 5 the voltage controlled oscillator is phase locked and its output frequency is adjusted significantly faster (for example 100 times as fast) than any expected changes in the signal to which it is phase locked. Therefore, the output of the voltage controlled oscillator is a very close replica of the input signal. The amplifier in the phase locked loop provides a high loop gain. In one embodiment, the phase locked loop has a loop gain of 55 dB at 50 KHz, and a unity gain at 1 to 2 MHz. A lead-lag compensator is used to pull down the frequency at unity gain.

Figure 6:
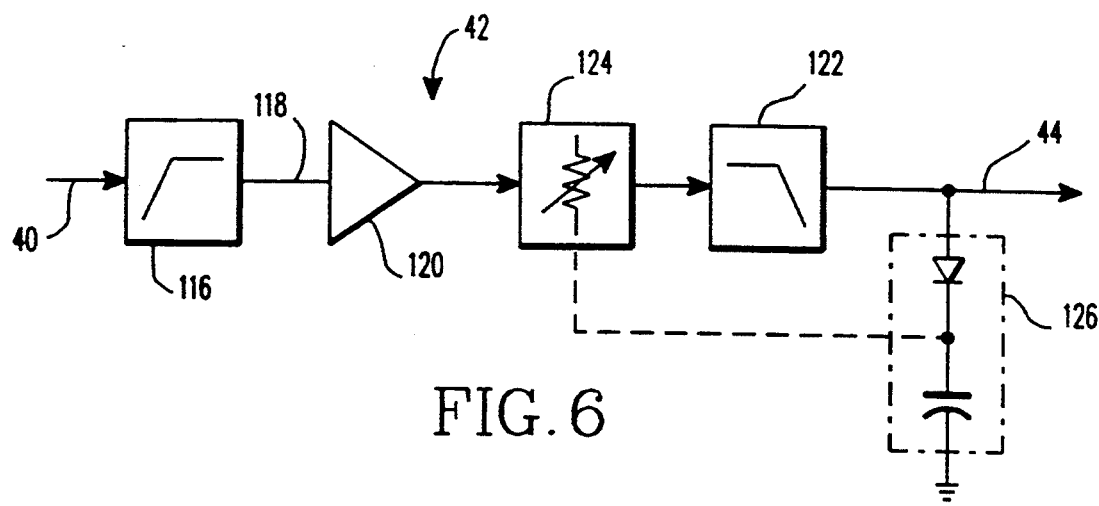
FIG. 6 is a block diagram of a filter circuit for use in the circuit of FIGS. 1, 2, 3, 4 or 5.

FIG. 6 is a block diagram of one embodiment of the filter 42 of FIGS. 1, 2, 3, 4 and 5. Filter 62 can be similarly constructed. In this embodiment, filter 42 is shown to include a high pass filter 116 which removes low frequency components from the signal on line 40 to produce a signal on line 118 which is amplified by amplifier 120 and passed to a low pass filter 122 by way of an attenuator 124. The low pass filter is selected to pass signals having frequencies less than one half of the bandwidth of the interfering signal plus one half of the bandwidth of the signal of interest, and to reject signals having frequencies greater than two times the bandwidth of the interfering signal. A detector 126 detects the signal on line 44 and controls the operation of the attenuator 124 to keep the level of the signal delivered to mixer 46 within the dynamic range of that mixer. If the interfering signal is intermittent, filter 42 must reject pulses which occur when the interfering signal is turned on. Therefore, the transient response of filter 42 is selected to reject changes in amplitude of the interfering signal.

Figure 7:
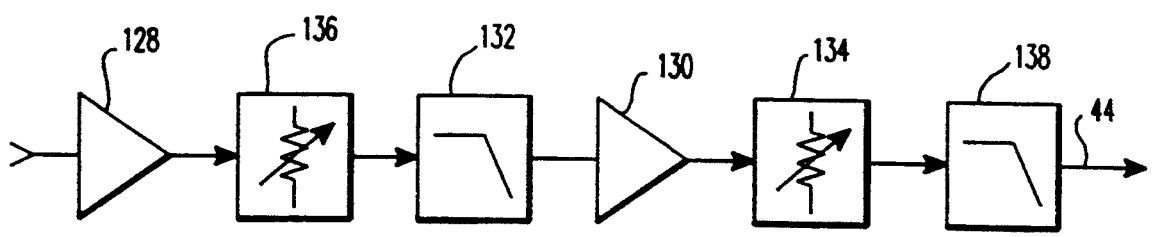
FIG. 7 is a block diagram of a circuit which can be used as the low pass filter depicted in FIG. 6.

FIG. 7 is a block diagram of a circuit which may be used in place of the filter 122 and attenuator 124 depicted in FIG. 6. In some applications of this invention it may be desirable to construct low pass filter 122 and attenuator 124 out of a chain of amplifiers 128 and 130, attenuators 132 and 134, and low pass filters 136 and 138 as shown in FIG. 7.

Figure 8:
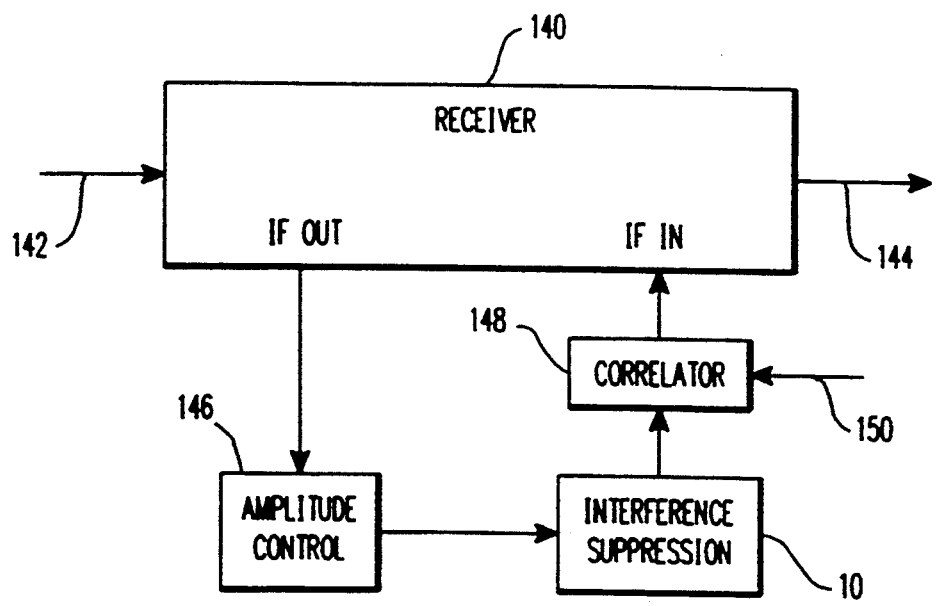
FIG. 8 is a block diagram of a radio receiver which incorporates the interference suppression circuit of FIGS. 1, 2, 3, 4 or 5.

FIG. 8 is a block diagram of a receiver system which incorporates the interference suppression circuit of FIGS. 1, 2, 3 or 4. The receiver system includes a receiver 140 having an input 142 for receiving a radio signal from an antenna and an output 144 for connection to a speaker. The receiver converts the received radio frequency signals to an intermediate frequency (IF). The IF signals are then passed to an amplitude leveler 146 which controls the signal level into the interference suppression circuit. The interference suppression circuit suppresses the interfering signal and returns the IF signal to the IF stage of the receiver. In the case of a wideband interfering signal, the suppression is achieved directly by virtue of the relative bandwidths of the interfering signal and the SOI. With a very modest frequency separation, superior adjacent channel rejection can be achieved despite the fact that the third order interference product (at a doubled frequency separation) is of equal magnitude to the desired signal. Most radio frequency receivers can be easily modified to incorporate the present invention. If the signal of interest is a spread spectrum signal, a correlator 148 and control input 50 may be inserted as shown.

Figure 9:
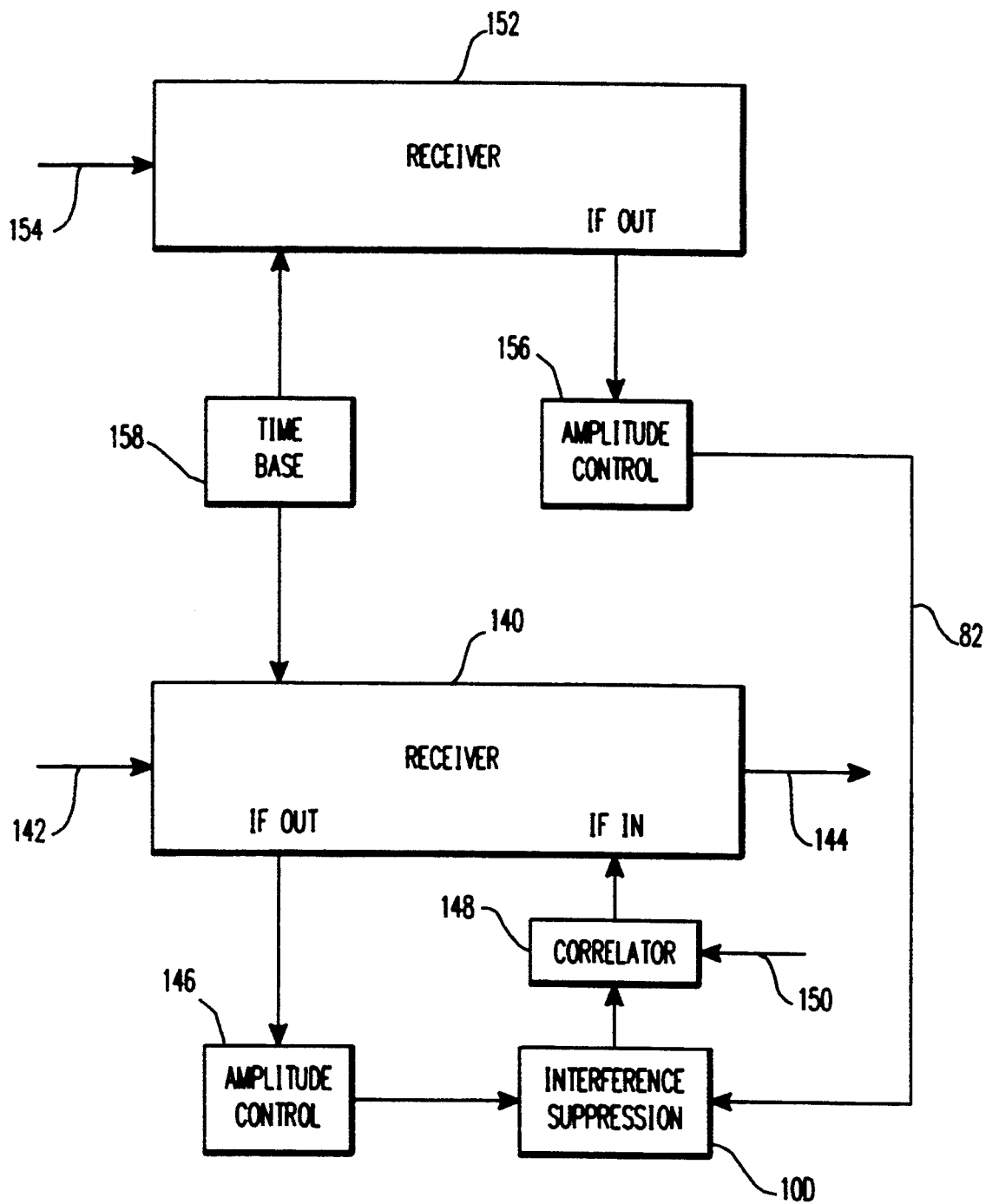
FIG. 9 is a block diagram of an alternative radio receiver which incorporates the interference suppression circuit of FIGS. 1, 2, 3, 4 or 5.

FIG. 9 is a block diagram of a receiver system which uses the interference suppression circuit of FIG. 5. In FIG. 9, a second receiver 152 receives a sample of the interfering signal on line 154. The interfering signal is converted to an intermediate frequency signal and limited by amplitude control circuit 156 to provide the sample of the interfering signal to input 82 of the interference suppression circuit 10D. A time base control 158 synchronizes the two receivers. This system may be used for cooperative interference suppression.

Figure 10:
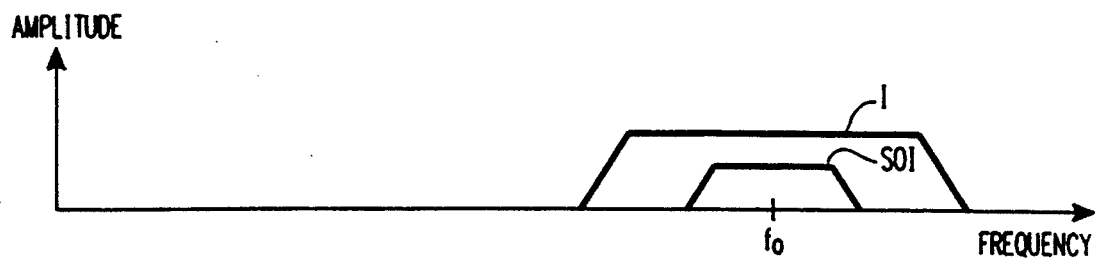
FIGS. 10, 11, 12, 13 and 14 are a series of schematic waveform diagrams which illustrate the operation of the interference suppression circuits of FIGS. 1, 2, 3, 4 and 5.

The operation of the above circuits can be explained by initially assuming that the interfering signal (I) has a constant envelope with a bandwidth and amplitude greater than that of the desired SOI, and completely overlapping the desired SOI as illustrated in FIG. 10. In FIGS. 10–14, I represents the interfering signal and SOI represents the signal of interest. The combination of these two signals is the corrupted signal. To perform the signal suppression method of this invention, first the interference corrupted signal is mixed (multiplied) with itself.

Figure 11:
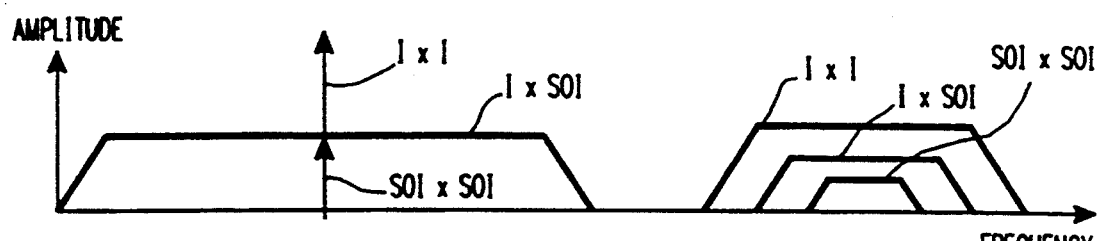
Figure 12:
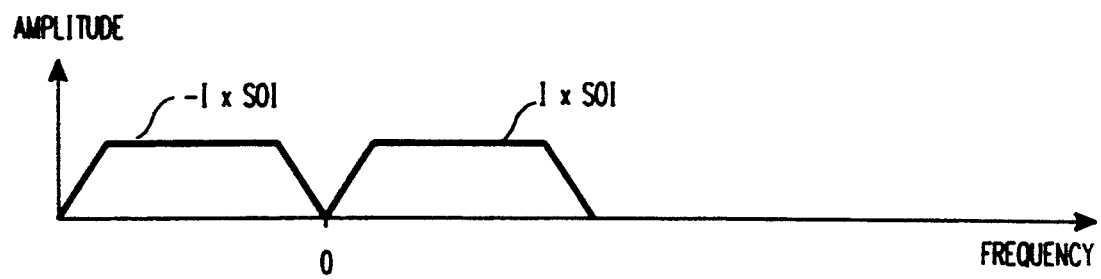
Figure 13:
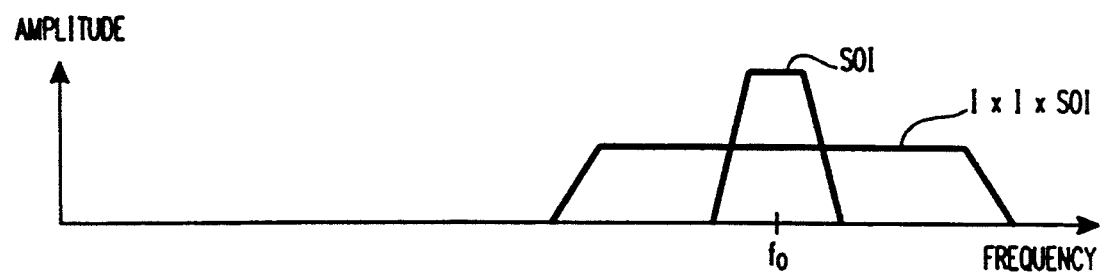

The mixing process generates cross-products of the form I×I, SOI×SOI, and I×SOI, as shown in FIG. 11. The resulting sum terms are easily removed with a simple filter. Only the difference terms remain and are of interest. Since the interfering signal is assumed to be of much greater amplitude, the SOI×SOI cross-product has a relatively low magnitude and is insignificant. Further, the I×I difference term appears as a carrier, since the interference is assumed to have a constant envelope (angle modulation only), and is again easily removed with a notch filter to obtain the filtered signal shown in FIG. 12. The bandwidth of the remaining term is approximately twice the sum of the bandwidths of the individual I and SOI signals. This remaining cross-product is then mixed again with the original corrupted signal thereby stripping the interfering signal cross modulation. Neglecting non-ideal mixer characteristics, such as local oscillator isolation, the terms remaining after this operation comprise two signals with significant amplitude. Some simple trigonometric manipulation will show the first term to be effectively a third order intermodulation product of the form (I×I×SOI), while the second term is the SOI itself, as shown in FIG. 13. Since the terms are equal in total power, the effective signal-to-interference ratio in the bandwidth of the desired signal is $(1+2(B_I/B_{SOI}))$, assuming that the I and SOI overlap in frequency. Further note, however, that if I and SOI do not overlap, the third order "interference" product is separated from the SOI by twice the initial frequency separation. In the cooperative suppression scheme of FIG. 5, the amplitude of the I×I×SOI term in the output signal would be negligible, so that the output signal appears as shown in FIG. 14.

The above description assumes that the interference signal was both constant envelope and of significantly greater bandwidth than the desired signal. If the SOI is a spread spectrum signal, the interference suppression gain adds to the processing gain of a subsequent correlator or matched filter, thereby enhancing the interference rejection properties of the overall system. Note that under no conditions, can the invention suppress interference which is equivalent to additive white Gaussian noise.

It should be apparent that this invention can enable the interception of low-level signals of interest in the presence of strong interference. It is also useful for the suppression of co-site/co-channel interference in tactical and strategic communications systems.

Although the invention has been described in terms of its preferred embodiments, it will be apparent to those skilled in the art that various changes may be made without departing from the scope of the invention. It is therefore intended that the appended claims cover such changes.

What is claimed is:

1. A circuit for separating a signal of interest from a composite signal including the signal of interest and an interfering signal, said circuit comprising:

means for generating a reference signal representative of said composite signal, said composite signal including said signal of interest and said interfering signal;

means for producing in-phase and quadrature components of said reference signal;

a first mixer for mixing said in-phase component of said reference signal with said composite signal to produce a first compound signal;

means for removing selected components from said first compound signal to produce a first filtered signal;

a second mixer for mixing said in-phase component of said reference signal with said first filtered signal to produce a second compound signal;

a third mixer for mixing said quadrature component of said reference signal with said composite signal to produce a third compound signal;

means for removing selected components from said third compound signal to produce a second filtered signal;

a fourth mixer for mixing said quadrature component of said reference signal with said second filtered signal to produce a fourth compound signal; and means for combining said second and fourth compound signals to produce an output signal, wherein the spectral power density of said signal of interest in said output signal is greater than the spectral power density of said interfering signal in said output signal.

2. A circuit according to claim 1, wherein said means for generating a reference signal comprises:

means for generating an error signal representative of the difference between said first and third compound signals; and a voltage controlled oscillator for producing said reference signal in response to said error signal.

3. A circuit according to claim 1, wherein:

said means for removing selected components from said first compound signal comprises a first high pass filter and a first low pass filter coupled in series with each other; and said means for removing selected components from said third compound signal comprises a second high pass filter and a second low pass filter coupled in series with each other.

4. A circuit according to claim 1, wherein:

said means for removing selected components from said first compound signal comprises a first high-pass filter, a first amplifier, a first attenuator and a first low pass filter connected in series with each other; and said means for removing selected components from said third compound signal comprises a second highpass filter, a second amplifier, a second attenuator and a second low pass filter connected in series with each other.

5. A circuit according to claim 1, wherein:

said means for removing selected components from said first compound signal comprises means for removing components of said first compound signal other than the cross product of the signal of interest and the interfering signal; and said means for removing selected components from said third compound signal comprises means for removing components of said third compound signal other than the cross product of the signal of interest and the interfering signal.

6. A circuit according to claim 5, wherein:

said means for removing components of said first compound signal other than said cross product of the signal of interest and the interfering signal comprises a first filter for removing components of said first compound signal centered at the sum of the frequencies of said signal of interest and the interfering signal, and a second filter for removing a component of said first compound signal representative of the cross product of said interference signal with itself; and said means for removing components of said third compound signal other than said cross product of the signal of interest and the interfering signal comprises a third filter for removing components of said third compound signal centered at the sum of the frequencies of said signal of interest and the interfering signal, and a fourth filter for removing a component of said third compound signal representative of the cross product of said interference signal with itself.

7. A circuit according to claim 1, further comprising:

an equalizing circuit connected between said means for removing selected components from said first compound signal and said second mixer, and connected between said means for removing selected components from said third compound signal and said fourth mixer.

8. A method for separating a signal of interest from a composite signal including the signal of interest and an interfering signal, said method comprising the steps of:

generating a reference signal representative of said composite signal, said composite signal including said signal of interest and said interfering signal;

producing in-phase and quadrature components of said reference signal;

mixing said in-phase component of said reference signal with said composite signal to produce a first compound signal;

removing selected components from said first compound signal to produce a first filtered signal;

mixing said in-phase component of said reference signal with said first filtered signal to produce a second compound signal;

mixing said quadrature component of said reference signal with said composite signal to produce a third compound signal;

removing selected components from said third compound signal to produce a second filtered signal;

mixing said quadrature component of said reference signal with said second filtered signal to produce a fourth compound signal; and combining said second and fourth compound signals to produce an output signal, wherein the spectral power density of said signal of interest in said output signal is greater than the spectral power density of said interfering signal in said output signal.

9. A method according to claim 8, wherein said step of generating a reference signal comprises:

generating an error signal representative of the difference between said first and third compound signals; and producing said reference signal in response to said error signal.

10. A circuit for separating a signal of interest from a composite signal including the signal of interest and an interfering signal, said circuit comprising:

means for generating a reference signal representative of said composite signal, said composite signal including said signal of interest and said interfering signal;

means for producing first and second components of said reference signal;

a first mixer for mixing said first component of said reference signal with said composite signal to produce a first compound signal;

means for removing selected components from said first compound signal to produce a first filtered signal;

a second mixer for mixing said first component of said reference signal with said first filtered signal to produce an output signal, wherein the spectral power density of said signal of interest in said output signal is greater than the spectral power density of said interfering signal in said output signal; and a third mixer for mixing said second component of said reference signal with said composite signal to produce an error signal, said reference signal being representative of said error signal.

11. A circuit according to claim 10, wherein:

said first component of said reference signal comprises an in-phase component; and said second component of said reference signal comprises a quadrature component.

12. A circuit according to claim 10, wherein:

said first component of said reference signal comprises a quadrature component; and said second component of said reference signal comprises an in-phase component.

13. A method for separating a signal of interest from a composite signal including the signal of interest and an interfering signal, said method comprising the steps of:

generating a reference signal representative of said composite signal, said composite signal including said signal of interest and said interfering signal;

producing first and second components of the reference signal;

mixing said first component of said reference signal with said composite signal to produce a first compound signal;

removing selected components from said first compound signal to produce a first filtered signal;

mixing said first component of said reference signal with said first filtered signal to produce an output signal, wherein the spectral power density of said signal of interest in said output signal is greater than the spectral power density of said interfering signal in said output signal; and mixing said second component of said reference signal with said composite signal to produce an error signal, said reference signal being representative of said error signal.

14. A method according to claim 13, wherein:
said first component of said reference signal comprises an in-phase component; and
said second component of said reference signal comprises a quadrature component.

15. A method according to claim 13, wherein:
said first component of said reference signal comprises a quadrature component; and
said second component of said reference signal comprises an in-phase component.

16. A circuit for separating a signal of interest from a composite signal including the signal of interest and an interfering signal, said circuit comprising:
means for generating a reference signal representative of said composite signal, said composite signal including said signal of interest and said interfering signal;
means for producing first and second components of said reference signal;
a first mixer for mixing said first component of said reference signal with said composite signal to produce a first compound signal;
a second mixer for mixing said second component of said reference signal with said composite signal to produce an error signal, said reference signal being representative of said error signal;
means for combining said first compound signal and said error signal to produce a second compound signal;
means for removing selected components from said second compound signal to produce a first filtered signal;
a third mixer for mixing said first component of said reference signal with said first filtered signal to produce a third compound signal;
a fourth mixer for mixing said second component of said reference signal with said first filtered signal to produce a fourth compound signal;
means for combining said third and fourth compound signals to produce an output signal, wherein the spectral power density of said signal of interest in said output signal is greater than the spectral power density of said interfering signal in said output signal.

17. A circuit according to claim 16, wherein:
said first component of said reference signal comprises an in-phase component; and
said second component of said reference signal comprises a quadrature component.

18. A circuit according to claim 16, wherein:
said first component of said reference signal comprises a quadrature component; and
said second component of said reference signal comprises an in-phase component.

19. A method for separating a signal of interest from a composite signal including the signal of interest and an interfering signal, said method comprising the steps of:
generating a reference signal representative of said composite signal, said composite signal including said signal of interest and an interfering signal;
producing said first and second components of the reference signal;

mixing said first component of said reference signal with said composite signal to produce a first compound signal;
mixing said second component of said reference signal with said composite signal to produce an error signal, said reference signal being representative of said error signal;
combining said first compound signal and said error signal to produce a second compound signal;
removing selected components from said second compound signal to produce a first filtered signal;
mixing said first component of said reference signal with said first filtered signal to produce a third compound signal;
mixing said second component of said reference signal with said first filtered signal to produce a fourth compound
combining said third and fourth compound signals to produce an output signal, wherein the spectral power density of said signal of interest in said output signal is greater than the spectral power density of said interfering signal is said output signal.

20. A method according to claim 19, wherein:
said first component of said reference signal comprises an in-phase component; and
said second component of said reference signal comprises a quadrature component.

21. A method according to claim 19, wherein:
said first component of said reference signal comprises a quadrature component; and
said second component of said reference signal comprises an in-phase component.

22. A radio frequency receiver comprising:
means for receiving a radio frequency signal, said radio frequency signal including a signal of interest and an interfering signal;
means for converting said radio frequency signal into an intermediate frequency composite signal;
means for generating a reference signal representative of said intermediate frequency composite signal, said intermediate frequency composite signal including said signal of interest and said interfering signal;
means for producing in-phase and quadrature components of said reference signal;
a first mixer for mixing said in-phase component of said reference signal with said intermediate frequency composite signal to produce a first compound signal;
means for removing selected components from said first compound signal to produce a first filtered signal;
a second mixer for mixing said in-phase component of said reference signal with said first filtered signal to produce a second compound signal;
a third mixer for mixing said quadrature component of said reference signal with said intermediate frequency composite signal to produce a third compound signal;
means for removing selected components from said third compound signal to produce a second filtered signal;
a fourth mixer for mixing said quadrature component of said reference signal with said second filtered signal to produce a fourth compound signal;
means for combining said second and fourth compound signals to produce an output signal, wherein the spectral power density of said signal of interest in said output signal is greater than the spectral power density of said interfering signal in said output signal; and means for extracting said signal of interest from said output signal.

23. A circuit for separating a signal of interest from a composite signal including the signal of interest and an interfering signal, said circuit comprising:
  means for generating a reference signal representative of said interfering signal;
  means for producing in-phase and quadrature components of said reference signal;
  a first mixer for mixing said in-phase component of said reference signal with said composite signal to produce a first compound signal, said composite signal including said signal of interest and said interfering signal;
  means for removing selected components from said first compound signal to produce a first filtered signal;
  a second mixer for mixing said in-phase component of said reference signal with said first filtered signal to produce a second compound signal;
  a third mixer for mixing said quadrature component of said reference signal with said composite signal to produce a third compound signal;
  means for removing selected components from said third compound signal to produce a second filtered signal;
  a fourth mixer for mixing said quadrature component of said reference signal with said second filtered signal to produce a fourth compound signal; and
  means for combining said second and fourth compound signals to produce an output signal, wherein the spectral power density of said signal of interest in said output signal is greater than the spectral power density of said interfering signal in said output signal.

24. A circuit according to claim 23, wherein said means for generating a reference signal comprises:
  a fifth mixer for mixing an in-phase component of said reference signal with said interfering signal to produce a fifth compound signal;
  a sixth mixer for mixing a quadrature component of said reference signal with said interfering signal to produce a sixth compound signal;
  means for generating an error signal representative of the difference between said fifth and sixth compound signals; and
  a voltage controlled oscillator for producing said reference signal in response to said error signal.

25. A circuit according to claim 23, wherein:
  said means for removing selected components from said first compound signal comprises a first high pass filter and a first low pass filter coupled in series with each other; and
  said means for removing selected components from said third compound signal comprises a second highpass filter and a second low pass filter coupled in series with each other.

26. A circuit for separating a radio frequency signal of interest from an interfering signal, according to claim 23, wherein:
  said means for removing selected components from said first compound signal comprises a first highpass filter, a first amplifier, a first attenuator and a first low pass filter connected in series with each other; and said means for removing selected components from said third compound signal comprises a second highpass filter, a second amplifier, a second attenuator and a second low pass filter connected in series with each other.

27. A circuit for separating a radio frequency signal of interest from an interfering signal, according to claim 23, wherein:
  said means for removing selected components from said first compound signal comprises means for removing components of said first compound signal other than the cross product of the signal of interest and the interfering signal; and
  said means for removing selected components from said third compound signal comprises means for removing components of said third compound signal other than the cross product of the signal of interest and the interfering signal.

28. A circuit for separating a radio frequency signal of interest from an interfering signal, according to claim 27, wherein:
  said means for removing components of said first compound signal other than said cross product of the signal of interest and the interfering signal comprises a first filter for removing components of said first compound signal centered at the sum of the frequencies of said signal of interest and the interfering signal, and a second filter for removing a component of said first compound signal representative of the cross product of said interference signal with itself; and
  said means for removing components of said third compound signal other than said cross product of the signal of interest and the interfering signal comprises a third filter for removing components of said third compound signal centered at the sum of the frequencies of said signal of interest and the interfering signal, and a fourth filter for removing a component of said first compound signal representative of the cross product of said interference signal with itself.

29. A method for separating a signal of interest from a composite signal including the signal of interest and an interfering signal, said method comprising the steps of:
  generating a reference signal representative of said interfering signal;
  producing in-phase and quadrature components of said reference signal;
  mixing said in-phase component of said reference signal with said composite signal to produce a first compound signal, said composite signal including said signal of interest and said interfering signal;
  removing selected components from said first compound signal to produce a first filtered signal;
  mixing said in-phase component of said reference signal with said first filtered signal to produce a second compound signal;
  mixing said quadrature component of said reference signal with said composite signal to produce a third compound signal;
  removing selected components from said third compound signal to produce a second filtered signal;
  mixing said quadrature component of said reference signal with said second filtered signal to produce a fourth compound signal; and
  combining said second and fourth compound signals to produce an output signal, wherein the spectral power density of said signal of interest in said output signal is greater than the spectral power density of said interfering signal in said output signal.

30. A method according to claim 29, wherein said step of generating a reference signal comprises:
  mixing an in-phase component of said reference signal with said interfering signal to produce a fifth compound signal;
  mixing a quadrature component of said reference signal with said interfering signal to produce a sixth compound signal;
  generating an error signal representative of the difference between said fifth and sixth compound signals; and
  producing said reference signal in response to said error signal.

31. A method of processing radio frequency signals, said method comprising the steps of:
  receiving a radio frequency signal, said radio frequency signal including a signal of interest and an interfering signal;
  converting said radio frequency signal to an intermediate frequency composite signal, said intermediate frequency composite signal including said signal of interest and said interfering signal;
  generating a reference signal representative of said interfering signal;
  producing in-phase and quadrature components of said reference signal;
  mixing said in-phase component of said reference signal with said intermediate frequency composite signal to produce a first compound signal;
  removing selected components from said first compound signal to produce a first filtered signal;
  mixing said in-phase component of said reference signal with said first filtered signal to produce a second compound signal;
  mixing said quadrature component of said reference signal with said intermediate frequency composite signal to produce a third compound signal;
  removing selected components from said third compound signal to produce a second filtered signal;
  mixing said quadrature component of said reference signal with said second filtered signal to produce a fourth compound signal;
  combining said second and fourth compound signals to produce an output signal, wherein the spectral power density of said signal of interest in said output signal is greater than the spectral power density of said interfering signal in said output signal; and
  extracting said signal of interest from said output signal.

32. A radio frequency receiver comprising:
  means for receiving a radio frequency signal, said radio frequency signal including a signal of interest and an interfering signal;
  means for converting said radio frequency signal into an intermediate frequency composite signal;
  means for generating a reference signal representative of said interfering signal;
  means for producing in-phase and quadrature components of said reference signal;
  a first mixer for mixing said in-phase component of said reference signal with said intermediate frequency composite signal to produce a first compound signal;
  means for removing selected components from said first compound signal to produce a first filtered signal;
  a second mixer for mixing said in-phase component of said reference signal with said first filtered signal to produce a second compound signal;
  a third mixer for mixing said quadrature component of said reference signal with said intermediate frequency composite signal to produce a third compound signal;
  means for removing selected components from said third compound signal to produce a second filtered signal;
  a fourth mixer for mixing said quadrature component of said reference signal with said second filtered signal to produce a fourth compound signal;
  means for combining said second and fourth compound signals to produce an output signal, wherein the spectral power density of said signal of interest in said output signal is greater than the spectral power density of said interfering signal in said output signal; and
  means for extracting said signal of interest from said output signal.

* * * * *